United States Patent
Yang et al.

(10) Patent No.: US 9,190,543 B2
(45) Date of Patent: Nov. 17, 2015

(54) SOLUTION-PROCESSED INORGANIC PHOTO-VOLTAIC DEVICES AND METHODS OF PRODUCTION

(75) Inventors: Yang Yang, Los Angeles, CA (US); Wei-Jen Hou, Cerritos, CA (US); Bao Lei, Los Angeles, CA (US); Shenghan Li, San Jose, CA (US)

(73) Assignee: The Regents of the University of California, Oakland, CA (US)

( * ) Notice: Subject to any disclaimer, the term of this patent is extended or adjusted under 35 U.S.C. 154(b) by 45 days.

(21) Appl. No.: 13/376,118

(22) PCT Filed: Jun. 4, 2010

(86) PCT No.: PCT/US2010/037469
§ 371 (c)(1),
(2), (4) Date: Dec. 2, 2011

(87) PCT Pub. No.: WO2010/141863
PCT Pub. Date: Dec. 9, 2010

(65) Prior Publication Data
US 2012/0073622 A1    Mar. 29, 2012

Related U.S. Application Data

(60) Provisional application No. 61/239,960, filed on Sep. 4, 2009, provisional application No. 61/184,104, filed on Jun. 4, 2009.

(51) Int. Cl.
*H01L 31/18*    (2006.01)
*H01L 31/032*   (2006.01)
(Continued)

(52) U.S. Cl.
CPC ........ *H01L 31/0322* (2013.01); *C23C 18/1204* (2013.01); *C23C 18/1225* (2013.01); *C23C 18/1291* (2013.01); *H01L 31/022425* (2013.01); *H01L 31/03923* (2013.01); *H01L 31/0725* (2013.01); *H01L 31/0749* (2013.01); *Y02E 10/52* (2013.01); *Y02E 10/541* (2013.01)

(58) Field of Classification Search
CPC ................... H01L 31/022425; H01L 31/0322; H01L 31/03923; H01L 31/0725; H01L 31/0749; C23C 18/1204; C23C 18/1225; C23C 18/1291
USPC ............................. 136/252, 264; 438/95, 37
See application file for complete search history.

(56) References Cited

U.S. PATENT DOCUMENTS 6,323,417 B1   11/2001   Gillespie et al.
6,875,661 B2    4/2005   Mitzi
(Continued)

OTHER PUBLICATIONS

Marian Nanu et al. "Inorganic Nanocomposites of n- and p-type Semiconductors: A New Type of Three-Dimensional Solar Cell". Advanced materials, 2004, vol. 16, No. 5, Mar. 5, 2004, pp. 453-455.
(Continued)

*Primary Examiner* — Jonathan Johnson
*Assistant Examiner* — Bethany L Martin
(74) *Attorney, Agent, or Firm* — Venable LLP; Henry J. Daley; F. Brock Riggs

(57) ABSTRACT

Methods of producing photo-voltaic devices include spray coating deposition of metal chalcogenides, contact lithographic methods and/or metal ion injection. Photo-voltaic devices include devices made by the methods, tandem photo-voltaic devices and bulk junction photovoltaic devices.

8 Claims, 17 Drawing Sheets

(51) Int. Cl.
*C23C 18/12* (2006.01)
*H01L 31/0224* (2006.01)
*H01L 31/0392* (2006.01)
*H01L 31/0725* (2012.01)
*H01L 31/0749* (2012.01)
*H01L 31/0272* (2006.01)
*H01L 31/036* (2006.01)

(56) References Cited

U.S. PATENT DOCUMENTS

| | | | | |
|---|---|---|---|---|
| 2002/0102839 A1* | 8/2002 | Gonzalez et al. | ............. | 438/629 |
| 2005/0158909 A1* | 7/2005 | Milliron et al. | ................ | 438/85 |
| 2007/0246094 A1 | 10/2007 | Brabec et al. | | |
| 2008/0124831 A1* | 5/2008 | Robinson et al. | ............... | 438/84 |
| 2008/0276987 A1* | 11/2008 | Flood | ............................ | 136/256 |
| 2009/0145482 A1* | 6/2009 | Mitzi et al. | .................... | 136/262 |

OTHER PUBLICATIONS

International Search Report and Written Opinion of PCT/us2010/037469.
Birkmire et al., "Specular CuInSe$_2$ films for solar cells", Appl. Phys. Lett. 53 (1988) 140-141.
Contreras et al., "High Efficiency Cu(In,Ga)Se$_2$-Based Solar Cells: Processing of Novel Absorber Structures", Proceedings of the 24th IEEE Photovoltaic Solar Energy Conference, Waikoloa, Hawaii, US (1994) 68-75.
Deegan et al., "Capillary flow as the cause of ring stains from fried liquid drops", Nature 389 (1997) 827-829.
Hou et al., "Solution-Processed Chalcopyrite Thin-film Solar Cell", OSA Solar Energy: New Materials and Nanostructured Devices for High Efficiency, Stanford, CA, USA, SWC1 2008; 1-3.
Hou et al., "Low-temperature processing of a solution-deposited CuInSSe thin-film solar cell", Thin Solid Films, 517(24), 6853-6856 (2009).
Huang et al., "A Semi-transparent Plastic Solar Cell Fabricated by a Lamination Process", Adv. Mater 20 (2008) 415-419.
Kessler et al., "Cu(In,Ga)Se$_2$ Thin Films Grown with a Cu-Poor/Rich/Poor Sequence: Growth Model and Structural Considerations" Photovolt : Res. Appl. 11 (2003) 319-331.
Komoda et al., "High Efficient OLEDs and Their Application to Lighting", J. Light & Vis. Env 32 (2008) 75-78.
Lany et al., "Light- and bias-induced metastabilities in Cu(In,Ga)Se$_2$ based solar cells cause by the VSe-VCu) vacancy complex", Journal of Applied Physics 100, 113725-1-113725-15 (2006).
Li et al., "High-efficiency solution processable polymer photovoltaic cells by self-organization of polymer blends", Nat. Mater. 4 (2005) 864-868.
Lundberg et al., "Rapid growth of thin Cu(In,Ga)Se$_2$ layers for solar cells", Thin Solid Films 431-432 (2003) 26-30.
Mitzi et al., "Low-Voltage Transistor Employing a High-Mobility Spin-Coated Chalcogenide Semiconductor", Adv. Mater. 17 (2005) 1285-1289.
Mitzi et al., "A High-Efficiency Solution-Deposited Thin-Film Photovoltaic Device", Adv. Mater., 20, 3657-3662 (2008).
Nakada et al., "Direct evidence of Cd diffusion into Cu(In,Ga)Se$_2$ thin films during chemical-bath deposition process of CdS films", Applied Physics Letters, 74, 2444-2446 (1999).
Nishiwaki et al., "A Stacked Chalcopyrite Thin-Film Tandem Solar Cell with 1.2 V Open-Circuit Voltage", Progress in Photovoltaics 11 (2003) 243-248.
Ouyang et al., "Conducting Polymer as Transparent Electric. Glue", Adv. Mater. 18 (2006) 2141-2144.
Ramanathan et al., "Advances in the CIS Research at NREL", IEEE Photovoltaic Specialist Conference, 319-322 (1997).
Schmid et al., "Optical modeling of chalcopyrite-based tandems considering realistic layer properties", Applied Physics Letters 94 (2009) 053507-1-053507-3.
Schmid et al., "Chalcopyrite/defect chalcopyrite heterojunctions on the bases of CuInSe$_2$," *J. AppL Phys*. 73 (1993) 2902-2909.
Schulz et al., "Cu—In—Ga—Se Nanoparticle Solloids as Spray Deposition Precursors for Cu(In,Ga)Se$_2$ Solar Cell Materials" J. of Electro. Mater. 27 (1998) 433-437.
Shafarman et al., "Losses in CuInSe$_2$-Based Thin Film Monolithic Tandem Solar Cells", Conference Record of the 31st IEEE Photovoltaics Specialists Conference, Jan. 3-7, 231-234 (2005).
Stolt et al., "ZnO/CdS/CuInSe$_2$ thin-film solar cells with improved performance" Appl. Phys. Lett. 62 (6) 597-599 (1993).
Urbaniak et al., "Kinetics of Charge Trapping and Emission in CIGS Solar Cells", Mater. Res. Soc. Symp. Proc. vol. 1012, 1012-Y12-16 (2007) 8 pages.
Walter et al., "Determination of defect distributions from admittance measurements and application to Cu(In,Ga)Se$_2$ based heterojunctions" J. Appl. Phys. 80 (8), 4411-4420 (1996).
Wei, et al., "Defect properties of CuInSe$_2$ and CuGaSe$_2$," Journal of Physics and Chemistry of Solids 66, 1994-1999 (2005).

* cited by examiner (a) Serial Tandem  (b) Parallel Tandem

| Ring # | d(Å) Measured values | d(Å) Average value | d(Å) PDF values | hkl | I (%) | Error (%) |
|---|---|---|---|---|---|---|
| | | | CuIn₃Se₅ | | | |
| 1 | 3.32<br>3.32<br>3.33<br>3.31 | 3.32 | 3.32 | 112 | 100 | 0.00<br>0.00<br>0.30<br>0.30 |
| 2 | 2.01<br>2.01<br>2.01<br>2.02 | 2.01 | 2.03 | 204 | 56 | 0.99<br>0.99<br>0.99<br>0.49 |
| 3 | 1.72<br>1.72<br>1.72<br>1.72 | 1.72 | 1.74 | 312 | 26 | 1.15<br>1.15<br>1.15<br>1.15 |

SOLUTION-PROCESSED INORGANIC PHOTO-VOLTAIC DEVICES AND METHODS OF PRODUCTION

CROSS-REFERENCE OF RELATED APPLICATION

This application claims priority to U.S. Provisional Application No. 61/184,104 filed Jun. 4, 2009 and U.S. Provisional Application No. 61/239,960 filed Sep. 4, 2009, the entire contents of which are hereby incorporated by reference, and is a national stage application under 35 U.S.C. §371 of PCT/US2010/037469 filed Jun. 4, 2010, the entire contents of which are incorporated herein by reference.

This invention was made with U.S. Government support of Grant Nos. 0822573, 0114443, 0507294, awarded by the National Science Foundation. The U.S. Government has certain rights in this invention.

BACKGROUND

1. Field of Invention

The current invention relates to inorganic photo-voltaic cells and more particularly to inorganic photo-voltaic cells comprising metal chalcogenides.

2. Discussion of Related Art

Thin-film solar cells are capable of delivering power conversion efficiencies of around 20% and have excellent lifetimes. However, a major hurdle for commercialization has been the cost associated with device fabrication, particularly with vacuum-based deposition of the thin film itself. A solution-deposition technique has been reported which circumvents the need for this vacuum-based deposition. Instead, the method utilizes a liquid solution of simple precursors, which can be spread thinly on a wide variety of substrates and heated to produce a thin, high-quality inorganic film of copper indium gallium diselenide (CIGS). This technique stands to dramatically reduce the cost of solar energy conversion and has already been used to fabricate a solar cell with power conversion efficiency in excess of 10%. The solution-based method is industrially scalable, high-throughput, and much less costly than many alternatives. However, due to the nascent level of this technology, several challenges remain before commercialization of solution-based CIGS can take place. Therefore, there remains a need for improved solution processed inorganic photo-voltaic devices.

SUMMARY

A method of producing a photo-voltaic device according to an embodiment of the current invention includes dissolving metal chalcogenides in a solvent to provide a precursor solution having a concentration of chalcogenides in solution of less than about 1 mmole/ml, heating a substrate to a temperature between 300° C. and 600° C., and spraying at least a portion of the precursor solution onto a structure comprising the substrate to be annealed to form at least part of an active layer of the photo-voltaic device.

A photo-voltaic device according to another embodiment of the current invention has a composite structure comprising a substrate and a first electrode, a second electrode spaced apart from the first electrode, a first active layer between and in electrical connection with the first and second electrodes, a third electrode spaced apart from the second electrode, and a second active layer between and in electrical connection with the second and third electrodes. At least one of the first and second active layers comprises annealed metal chalcogenides, the substrate is a common substrate for the first and second active layers so as to provide a tandem photo-voltaic cell, and the tandem photo-voltaic cell has a power-conversion efficiency greater than 3%.

A photovoltaic device according to another embodiment of the current invention has a first electrode, a second electrode spaced apart from the first electrode, and a bulk-junction active layer between and in electrical connection with the first and second electrodes. The bulk-junction active layer consists essentially of inorganic materials, and the bulk-junction active layer has a network structure of p-type and n-type inorganic semiconductors.

A method of producing a photo-voltaic device according to another embodiment of the current invention includes providing a component of the photo-voltaic device comprising an active layer comprising a metal chalcogenide, and injecting metal ions into the active layer by soaking the active layer in a bath solution comprising the metal ions.

A method of producing a photo-voltaic device according to another embodiment of the current invention includes providing a stamp having a patterned surface for contact printing lithography, applying one of a hydrophobic or hydrophilic layer of material onto said patterned surface of the stamp, applying the stamp to come into conformal contact with a substrate, removing the stamp to leave a transferred pattern of the hydrophobic or hydrophilic material to the substrate, depositing a semiconductor layer to the substrate over the transferred pattern, and removing portions of the deposited semiconductor layer while leaving other portions of the semiconductor layer to provide a patterned layer of semiconductor material with a pattern determined by the transferred pattern of the stamp.

BRIEF DESCRIPTION OF THE DRAWINGS

Further objectives and advantages will become apparent from a consideration of the description, drawings, and examples.

DETAILED DESCRIPTION

Figure 1:
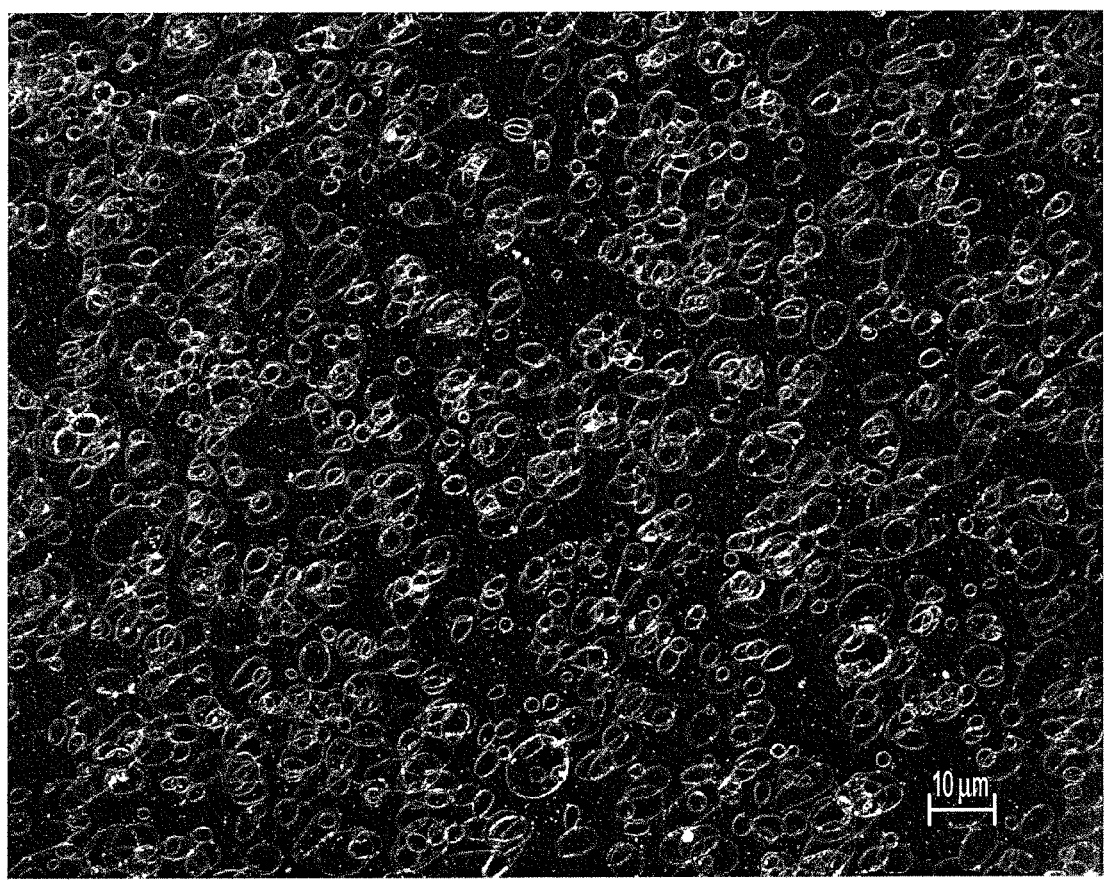
FIG. 1 is an optical image of a $CuInSe_2$ film deposited by spray coating on a Mo/glass substrate that was heated at 200° C. according to an embodiment of the current invention. The image shows a droplet size of 3-5 μm in this example.

Some embodiments of the current invention are discussed in detail below. In describing embodiments, specific terminology is employed for the sake of clarity. However, the invention is not intended to be limited to the specific terminology so selected. Standard symbols for various atomic elements are used throughout. A person skilled in the relevant art will recognize that other equivalent components can be employed and other methods developed without departing from the broad concepts of the current invention. All references cited anywhere in this specification are incorporated by reference as if each had been individually incorporated.

An embodiment of the current invention provides a method of producing a photo-voltaic device that includes dissolving metal chalcogenides in a solvent to provide a precursor solution having a concentration of chalcogenides in solution of less than about 1 mmole/ml, heating a substrate to a temperature between 300° C. and 600° C., and spraying at least a portion of the precursor solution onto a structure that includes the substrate to form at least part of an active layer of the photo-voltaic device. The term active layer is intended to refer to optically an active layer of material that participates in the absorption of light and conversion of it to electricity. In some embodiments of the current invention, the concentration of chalcogenides in solution can be less than 0.5 mmole/ml and greater than 0.05 mmole/ml.

This method can be used to produce one or more active layers on structures that include the same or separate substrates in some embodiments of the current invention. Furthermore, additional processing steps can be included according to some embodiments of the current invention for producing various additional structures of the photo-voltaic device depending on the particular application. The substrates can be, or include, materials selected according to the particular application. For example, a variety of glasses and plastics are suitable for use as substrates according to some embodiments of the current invention.

The solvent can be effectively purely hydrazine in some embodiments or it can be a mixture that includes hydrazine in other embodiments, for example. The metal chalcogenides of the precursor solution can include at least one of Cu, In, Ga, Zn, Sn, Na, K, Al or P in some embodiments of the current invention. For example, in some embodiments, the metal chalcogenides can include at least one of $Cu_2Se$, $Cu_2Te$, $In_2S_3$, $In_2Te_3$, CdTe, CdSe, CdS, $Ga_2S_3$, and $Ga_2Se_3$.

In some embodiments of the current invention, a method of producing a photo-voltaic device as described above can further include varying a concentration of copper in the precursor solution to provide a gradient of copper in a vertical direction as the spraying builds up the active layer in the vertical direction so as to provide an average grain size of least 20 nm. In some embodiments, the average grain size is at least 1 μm.

A method of producing a photo-voltaic device according to some embodiments of the current invention can further include spraying at least a second portion of the precursor solution onto a composite structure that includes the substrate and the previously produced active layer to form at least part of a second active layer of the photo-voltaic device to provide a tandem photo-voltaic device that includes at least two electrically connected active layers.

Example

Formation of $CuInSe_2$-Based Films Through Small Solution Droplets

Currently, the only deposition method demonstrated for the hydrazine-based solution-CIGS technology is spin coating (D. B. Mitzi, M. Yuan, W. Liu, A. J. Kellock, S. J. Chay, V. Deline, A. G. Schrott, Adv. Mater. 20 (2008) 3657). This technique, although feasible at research scale, is unsuitable for full-scale production. In order to address this deficiency, we have developed a fully scalable technique for deposition—spray coating. One attempt has been performed to employ spray coating for the nanoparticle-derived CIGS photovoltaic device (D. L. Schulz, C. J. Curtis, R. A. Flitton, H. Wiesner, J. Keane, R. J. Matson, K. M. Jones, P. A. Parilla, R. Noufi, D. S. Ginley, J. of Electro. Mater. 27 (1998) 433). However, due to the nature of colloidal processing, the resulting CIGS film exhibited a porous morphology. The conversion from porous to a dense large-grain morphology required additional annealing and evaporation in a vacuum environment, which renders the prior use of a low cost solution-processing step meaningless. Unlike the nanoparticle-derived method, hydrazine-based processing is capable of producing dense CIGS films without additional vacuum deposition.

Metal chalcogenides, such as $In_2Se_3$ and $Cu_2S$ are first dissolved in hydrazine and then mixed in the desired ratio to form the precursor solution (U.S. Pat. No. 6,875,661 B2). Prior to spray coating, excess hydrazine is introduced to dilute the precursor solution to give the desired concentration. During the deposition, the substrate can be heated in order to control the solvent evaporation rate or precursor decomposition rate. An image of the spray-coated $CuInSe_2$ film taken by optical microscope is shown in FIG. 1. We found that it is critical to spray the precursor solution on substrates that have been heated to achieve the desirable morphology.

In addition to processing scalability, spray coating also conforms to processing requisites for depositing the absorber layer. For instance, the metal ratio in the resulting film can be controlled precisely in the lateral direction by the ratio in the precursor solution. The thickness of the deposited film can be varied from nanometers to micrometers depending on the spraying time and solvent concentration. A concentration gradient of Cu in the vertical direction can be achieved by varying the Cu concentration in the precursor solution to achieve large grain size of the CIGS layer.

Figures 2A, 2B:
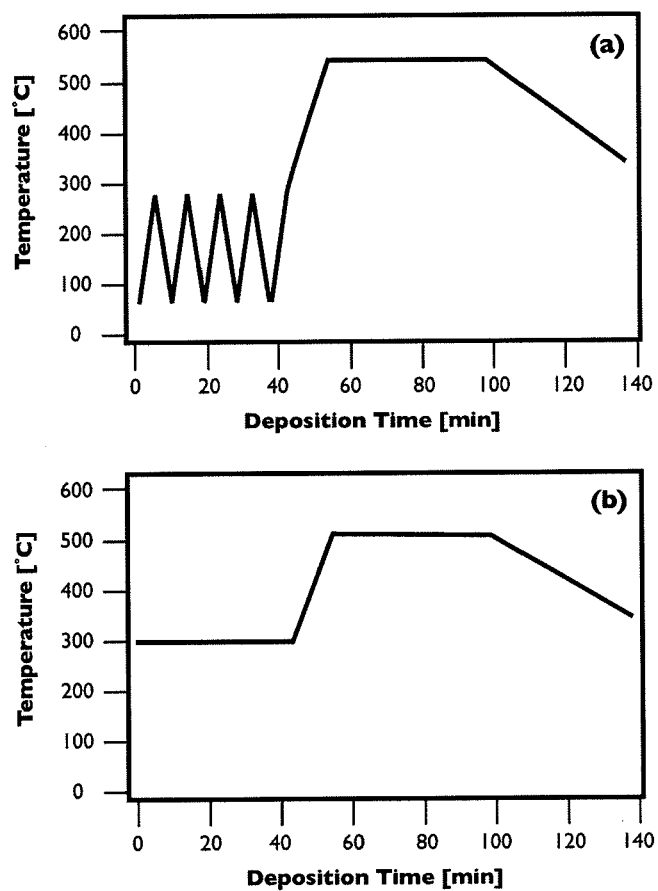
FIGS. 2(a) and 2(b) show thermal profiles of a CIGS layer deposited by (a) spin-coating and (b) spray-coating according to an embodiment of the current invention.

An advantage of depositing the absorber layer by spray coating can include the ability to simultaneously perform annealing during deposition. In the hydrazine-based deposition, annealing is performed to convert the precursor solution to the CIGS structure. With spray coating, each precursor layer deposited can be converted to the CIGS structure by keeping the substrate heated at the desired temperature. Compared to other wet coating methods such as doctor-blading, spincoating, or screen-printing, spray coating allows the substrate to be kept at a constant elevated temperature without cooling. This not only circumvents the issues associated with film cracking due to multiple heating and cooling cycles (FIG. 2a), it also offers the potential to mimic the deposition profile of that obtained using the co-evaporation process (FIG. 2b) (Contreras, M. A.; Tuttle, J.; Gabor, A.; Tennant, A.; Ramanathan, K.; Asher, S.; Franz, A.; Keane, J.; Wang, L.; Scofield, J.; Noufi, R in: Proceedings of the 24th IEEE Photovoltaic Solar Energy Conference, Waikoloa, Hi., US (1994) 68; O. Lundberg, M. Bodegard, and L. Stolt, Thin Solid Films 431-432 (2003) 26; J. Kessler, C. Chityuttakan, J. Lu, J. Scholdstrom, and L. Stolt Prog. Photovolt: Res. Appl. 11 (2003) 319). For instance, the first layer can be sprayed at substrate temperature of greater than 300° C. to avoid the loss of selenium and to achieve the formation of $MoSe_2$. Next the substrate temperature is raised to 500° C. resulting in the conversion from the precursor to the CIGS structure as well as subsequent grain growth. The elimination of heating and cooling cycles for each deposition, in the case of spincoating or doctorblading, alleviates the build-up of stress in the thin film.

Figure 3A:
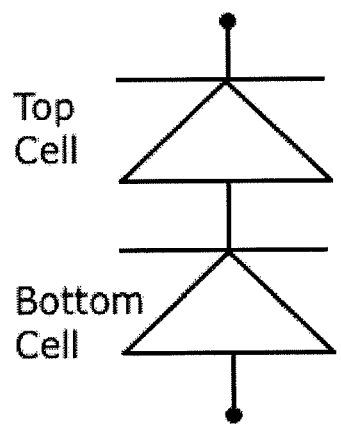
FIGS. 3(a) and 3(b) show circuit diagrams illustrating two tandem structures according to embodiments of the current invention.
Figure 3B:
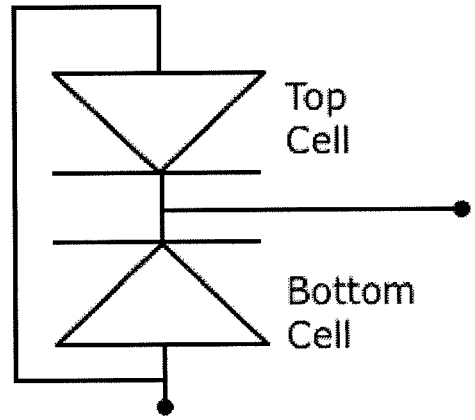
Figure 4:
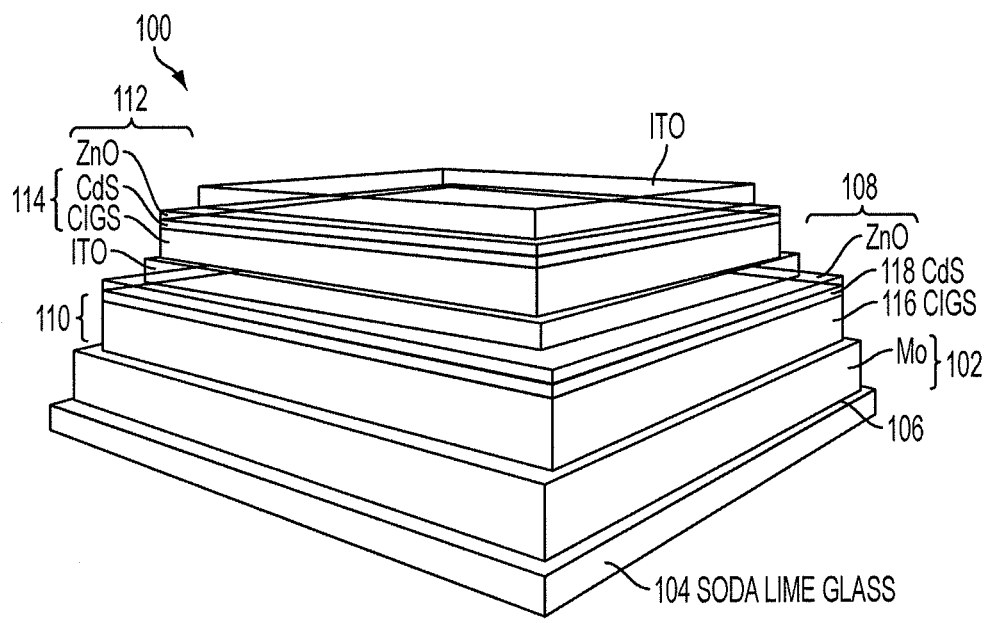
FIG. 4 is a schematic illustration of a tandem photo-voltaic device in serial connection according to an embodiment of the current invention.

Another embodiment of the current invention is directed to tandem photovoltaic structures. FIGS. 3(a) and 3(b) are circuit diagrams that illustrate the electrical model of serial and parallel tandem photovoltaic structures, respectively, according to an embodiment of the current invention. FIG. 4 is a schematic illustration of a photo-voltaic device 100 according to an embodiment of the current invention. The photo-voltaic device 100 is a serial tandem photo-voltaic device. The photo-voltaic device 100 includes a composite structure 102 that includes a substrate 104 and a first electrode 106, a second electrode 108 spaced apart from the first electrode 106, a first active layer 110 between and in electrical connection with the first and second electrodes (106, 108), a third electrode 112 spaced apart from the second electrode 108, and a second active layer 114 between and in electrical connection with the second and third electrodes (108, 112). At least one of the first active layer 110 and second active layer 114 comprises annealed metal chalcogenides, and the tandem photo-voltaic cell according to some embodiments of the current invention has a power-conversion efficiency greater than 3%. In some embodiments, both the first active layer 110 and second active layer 114 can comprise annealed metal chalcogenides, but the scope of the invention is not limited to only such a structure. One of the first active layer 110 and second active layer 114 can also include other inorganic or organic materials, including conventionally available materials in some embodiments. The tandem photo-voltaic cell according to some embodiments of the current invention has a power-conversion efficiency greater than 9%.

In this example, the substrate 104 is soda lime glass; however, the broad concepts of the invention are not limited to only this example. The first electrode 106 in this example is molybdenum (Mo), which is found to be suitable since it forms a MoSe layer due to the deposited CIGS layer of the first active layer 110. In this example, the first active layer 110 includes a CIGS layer 116, formed by spray coating according to an embodiment of the current invention, and a layer of CdS 118.

In this example, the CIGS layer is a p-type semiconductor and the CdS layer is an n-type semiconductor to provide an active layer that includes a p-n junction. The second active layer similarly includes a CIGS layer and a CdS layer. Each of the second electrode 108 and third electrode 112 includes an indium tin oxide (ITO) layer and a buffer layer. In this example, the buffer layer is ZnO.

Figure 5:
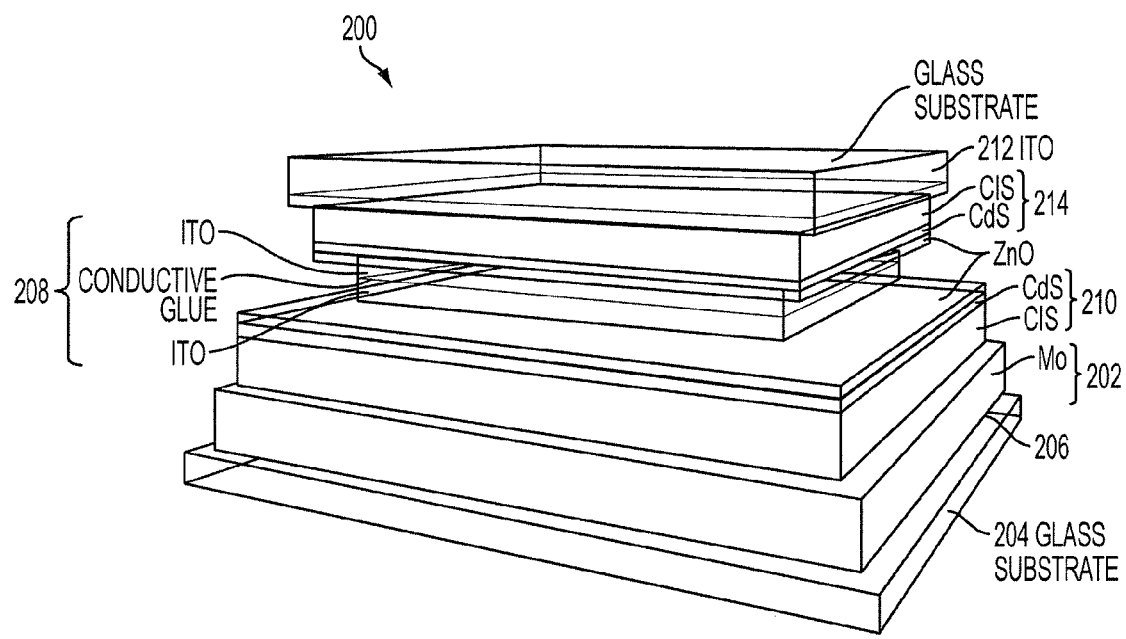
FIG. 5 is a schematic illustration of a tandem photo-voltaic device in parallel connection according to an embodiment of the current invention.

FIG. 5 is a schematic illustration of a photo-voltaic device 200 according to an embodiment of the current invention. The photo-voltaic device 200 is a parallel tandem photo-voltaic device. The photo-voltaic device 200 includes a composite structure 202 that includes a substrate 204 and a first electrode 206, a second electrode 208 spaced apart from the first electrode 206, a first active layer 210 between and in electrical connection with the first and second electrodes (206, 208), a third electrode 212 spaced apart from the second electrode 208, and a second active layer 214 between and in electrical connection with the second and third electrodes (208, 212). At least one of the first active layer 210 and second active layer 214 comprises annealed metal chalcogenides, and the tandem photo-voltaic cell according to some embodiments of the current invention has a power-conversion efficiency greater than 3%. In some embodiments, both the first active layer 210 and second active layer 214 can comprise annealed metal chalcogenides, but the scope of the invention is not limited to only such a structure. One of the first active layer 210 and second active layer 214 can also include other inorganic or organic materials, including conventionally available materials in some embodiments. The tandem photo-voltaic cell according to some embodiments of the current invention has a power-conversion efficiency greater than 9%.

This embodiment shares some structures in common with the embodiment of FIG. 4; however, a significant difference is that the photo-voltaic device 200 was formed by gluing together two separate photo-voltaic cells in a parallel connection arrangement. Consequently, the second electrode includes two ITO layers and conductive glue as well as upper and lower ZnO layers Example Tandem Structure Even though hydrazine-based deposition offers cost advantages, the power conversion efficiency (PCE) is significantly lower than that of the 19.9% demonstrated by the vacuum-deposited CIGS solar cell. One way to improve the PCE is by adopting multiple solar cells in a tandem structure. This structure, combined with spray coating methods according to some embodiments of the current invention, can offer great processing advantage for CIGS solar cells. Despite the great potential, several prior attempts at fabricating CIS solar cells in tandem structures have resulted in efficiencies lower than that achieved in a single cell. The most efficient stacking structure was achieved by simply making two cells on two substrates and stacking them together (S. Nishiwaki, S. Siebentritt, P. Walk, and M. Ch. Lux-Steiner, Progress in Photovoltaics 11 (2003) 243). However, the process based on separate substrates is inconvenient for panel integration, and introduces optical losses (M. Schmid, 1, J. Krč, R. Klenk, M. Topič, and M. Ch. Lux-Steiner, Applied Physics Letters 94 (2009) 053507). Monolithic tandem cells, in which both cells are fabricated on the same substrate, have also been demonstrated (W. N. Shafarman and P. D. Paulson, Conference Record of the 31st IEEE Photovoltaics Specialists Conference, 3-7 January 231-234 (2005)); however, only 2.7% efficiency was achieved. The decrease in efficiency is related to the deterioration caused by the requirement to deposit the CIGS layer at a high temperature, typically around 500° C.

Figure 6:
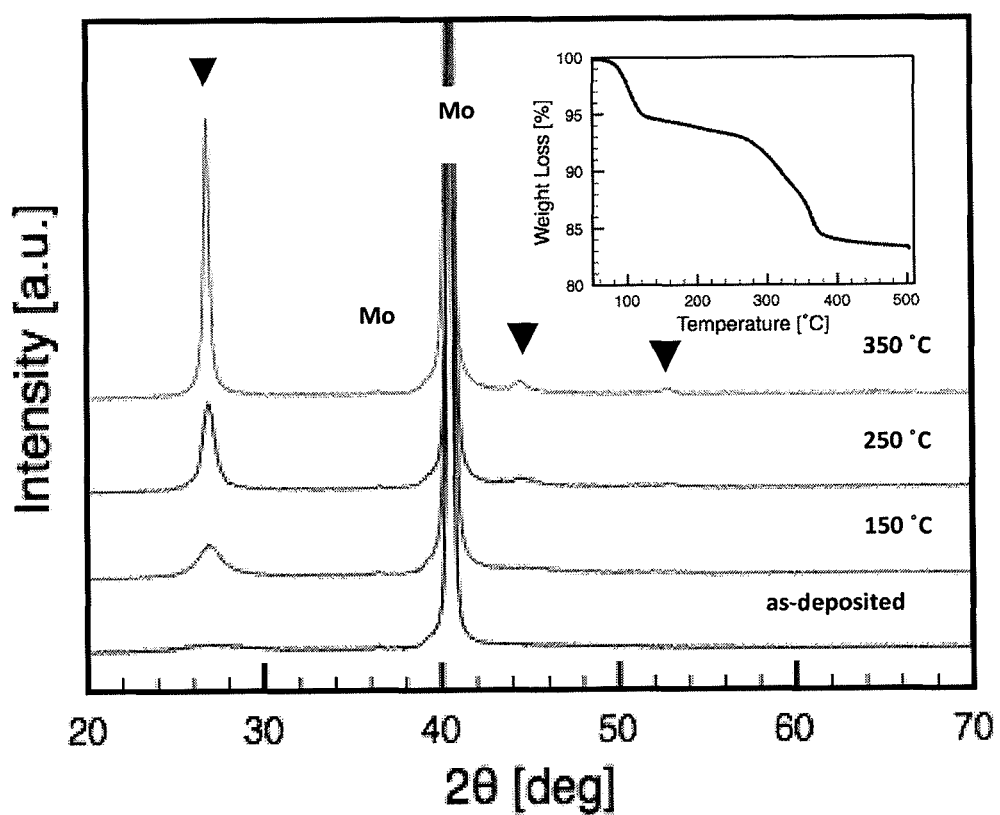
FIG. 6 shows x-ray diffraction of precursor films deposited on a Mo-substrate and thermally annealed at 150° C., 250° C., and 350° C. according to an embodiment of the current invention. Reflections of CuInSSe are marked with (▼). Inset: thermogravimetric analysis of the precursor material measured under a heating rate of 2° C./min.

According to some embodiments of the current invention, tandem structures can be made with low-temperature processing methods using hydrazine. Based on the structural evolution of the hydrazine-method shown in FIG. 6, CIS materials can be fabricated at temperatures as low as 350° C. Low fabrication temperature can be important to avoid damaging the bottom cell during the fabrication of the top cell in a monolithic tandem structure. A solar cell with 9.1% efficiency has been demonstrated by our group using this low temperature process.

Two different tandem cell structures according to embodiments of the current invention include serial tandem and parallel tandem structures. The equivalent circuit diagrams of the two structures are shown in FIGS. 3(a) and 3(b).

The tandem structure in serial connection is shown in FIG. 4. It consists of two individual CIGS solar cells connected by a common transparent electrode, indium tin oxide. The bottom cell corresponds to our current baseline single cell. A molybdenum layer with a thickness of 1 μm can be sputtered onto a soda-lime glass substrate. The CIGS precursor solution can then be coated onto the molybdenum electrode, and followed by chemical bath deposition of the cadmium sulfide (CdS) layer. A 50 nm thick intrinsic zinc oxide (ZnO) film and 100 nm thick ITO top electrode layer can be subsequently deposited by sputtering. A difference compared to a single cell is that the thickness of the absorber layer (layer of active material) can be reduced due to the less light input. The top cell is made from a different design in this example such that ITO is used as both the cathode and the anode, and the CIGS absorber has been adjusted to a higher bandgap so that the two layers are absorbing light in complementary spectral ranges.

FIG. 5 is a schematic illustration of a parallel tandem structure according to an embodiment of the current invention includes an interconnecting layer of conducting glue. The conducting glue can be sufficiently transparent at operating wavelengths to allow suitable amounts of light to pass through to be absorbed by the underlying layer of active material. The two single cells can share the same structure and material selection as the described above, but they are fabricated on two separate glass substrates. Then, conductive polymer glue (Ouyang and Y. Yang. Adv. Mater. 18 (2006) 2141), which we used to demonstrate the lamination process for polymer solar cells (Huang, G. Li, and Y. Yang, Adv. Mater 20 (2008) 415), is applied to stick the two cells together. The glue provides both mechanical and electrical contact between the ITO top electrodes of the two cells. This approach can further minimize the degradation of the bottom cell during fabricating the top cell, as well as alleviating connection and optical loss problems of conventional stacked substrates.

In a tandem structure with a serial connection, the open-circuit voltage of the entire cell will be the sum of that from individual cells, and the short-circuit current will be limited by the cell with the lower current. However, a potential challenge can be the loss due to poor current matching. We can address this issue by tuning the bandgap of the two cells by varying the gallium concentration variation, and the thickness of the two cells. On the other hand, for the parallel connection, the short-circuit currents will be the sum of that from each individual cell. The efficiency is ultimately limited by the low open circuit voltage. In this case, we can optimize the bandgap, and refine the solution deposition technique to minimize the loss of the open circuit voltage due to recombinations.

Patterning Using a Self-Assembled Monolayer

Another embodiment of the current invention is directed to a method of producing a photo-voltaic device that includes providing a stamp having a patterned surface for contact printing lithography, applying one of a hydrophobic or hydrophilic layer of material onto said patterned surface of said stamp, applying the stamp to come into conformal contact with a substrate, removing the stamp to leave a transferred pattern of the hydrophobic or hydrophilic material to the substrate, depositing a semiconductor layer to the substrate over the transferred pattern, and removing portions of the deposited semiconductor layer while leaving other portions of the semiconductor layer to provide a patterned layer of semiconductor material with a pattern determined by the transferred pattern of the stamp. Materials that are suitable for the stamp according to some embodiments of the current invention include, but are not limited to, PDMS (Polydimethylsiloxane) and Fluorosilicone. The hydrophobic layer can be formed on the stamp using an amphiphilic material, for example, that has a hydrophilic head group which attaches to the substrate and a hydrophobic tail which faces the top. Suitable materials for some applications include silanes, for example, such as OTS (Octadecyltrichlorosilane), chlorosilane; or a thiol, for example, ODT (Octadecanethiol) or alkane thiols.

In addition to the advantage of low-cost fabrication, solution-processing can also offer the ability to pattern the resulting film by controlling the surface hydrophobicity. A desirable patterning method should be simple, high yield, and functional over an entire substrate. Chemists have delivered a simple plastic stamp, poly(dimethylsiloxane) (PDMS), which is easy to fabricate and resistant to most organic solvents. During the conformal contact, freshly prepared PDMS stamps will transfer the unreacted low molecular weight monomer to the substrate surface, leading to a hydrophobic surface. By tailoring the surface hydrophobicity, high resolution patterns can therefore be registered on the substrates.

One application using the transferring technique is to eliminate the scribing process in patterning solution-deposited films. For instance, in monolithic integration of CIGS solar cells, laser/mechanical scribing is being employed to isolate a certain layer from the above or layers underneath. Although this process offers great control in depth, it is time-consuming (5 cm/s) and costly. With the ability to solution-process the CIGS layer with hydrazine solutions, we can now deposit and pattern this layer in one simple step. First, the substrate (Mo/soda-lime glass) is stamped with PDMS in a desirable pattern. Next, the CIGS precursor solution is deposited by various solution-processing techniques such as spin-coating, spray-coating, and/or dip-coating. Due to the changes in surface hydrophobicity on regions stamped with PDMS, the precursor solution is confined to areas that were not patterned. After subsequent annealing at temperatures above the decomposition point of the precursor solution, a patterned CIGS layer is obtained.

For applications that require a significant thickness of the deposited layer, repeating deposition is needed. In this case, spray coating is more suitable to avoid the "edge-effect" commonly observed in spin-coated films. The edge-effect is caused by capillary flow during solvent evaporation (R. D. Deegan, O Bakajin, T F Dupont, G Huber, S R Nagel, T A Witten, Nature 389 (1997) 827). With spray coating, the substrate is kept at an elevated temperature during coating to control the solvent evaporation rate, which suppresses capillary flow.

Figure 7:
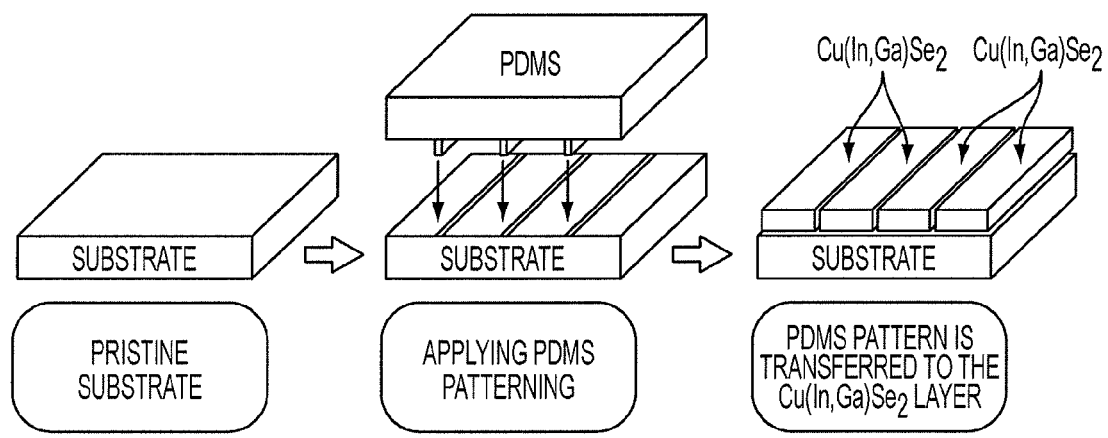
FIG. 7 is a schematic illustration of a method of producing photo-voltaic devices according to an embodiment of the current invention.

Patterning the substrate can also be beneficial to improve the device yield in large-scale manufacturing by defining small cell areas using PDMS patterning. In CIGS technology, there is a large discrepancy between the highest efficiency demonstrated in a solar cell and that in a solar module, which is comprised of many solar cells connected in series. This discrepancy is mainly attributable to the challenges in ensuring uniform device efficiency in every cell fabricated. When the cells are connected together, the overall efficiency of the module is limited by the cell with the worst efficiency. By fabricating cells at a smaller area (<1 cm$^2$), one can limit the extent of damage due to impurity or external sources. With scribing, smaller area means longer scribing time per module, which renders this size advantage unfeasible. However, with patterning using PDMS, the advantages of simple processing and smaller area are preserved. A process flow chart of the PDMS patterning procedure is illustrated schematically in FIG. 7.

The patterning technique using PDMS can be further applied to the deposition of a grid. In thin-film solar cells, grids are used to enhance the collection of photocarriers. The deposition process is typically performed by thermal evaporation via a shadow mask or inkjet printing. PDMS could be used to pattern the grid shape and the grid materials could be deposited by spray coating using suspensions of metallic particles such as aluminum (Al), silver (Au), and copper (Cu).

Bulk-Junction Photo-Voltaic Devices

Another embodiment of the current invention is directed to bulk junction photo-voltaic devices. In solid-state photovoltaic cells, the semiconductor junction serves as the power-generating component in which a semiconductor forms a rectifying junction (or pn-junction) with another semiconductor. This rectifying junction is typically fabricated in a bi-layer configuration using inorganic materials such as Si, $CuInSe_2$, $Cu(In,Ga)Se_2$, $CuIn(S,Se)_2$, CdS, and CdTe. This type of configuration is referred to as a single junction, and is commonly fabricated using sequential growth methods such as sputtering or MOCVD. A second type of configuration has emerged using organic materials. Instead of a bi-layer geometry, it is fabricated in a network geometry by blending two different organic materials. This is referred to as a bulk-heterojunction device (G. Li, V. Shrotriya, J. Huang, Y. Yao, T. Moriarty, K. Emery, Y. Yang. Nat. Mater. 4 (2005) 864). The term heterojunction refers to the junction that is formed by two dissimilar materials. If the junction is formed by similar materials, but with different polarity (p- and n-type), it is referred to as homojunction. Advantages of a network geometry for the junctions can include compensating for the low carrier mobility and increasing the contact area between the p- and n-type materials. The term "network geometry" for the junctions is intended to indicate the p-n junctions are distributed at least to some degree through the bulk of the semiconductor, rather than being confined merely to an interface between two layers. However, homojunctions fabricated in a network geometry have not been demonstrated in the prior art. According to an embodiment of the current invention, a method of fabricating homojunction photo-voltaic devices that have a network geometry is demonstrated by using a chalcopyrite material—$CuInSe_2$. However, this method is not limited to only homojunction devices and also includes the fabrication of heterojunction photo-voltaic devices. Because this method is not limited to the type of semiconducting materials, the junction fabricated using methods according to this embodiment of the current invention will be referred to as bulk-junction (BJ).

In organic systems, bulk-heterojunction structures have been demonstrated by both vacuum-based thermal evaporation (T. Komoda, N. Ide, J. Kido, J. Light & Vis. Env 32 (2008) 75) and solution-deposition (G. Li, V. Shrotriya, J. Huang, Y. Yao, T. Moriarty, K. Emery, Y. Yang. Nat. Mater. 4 (2005) 864). On the other hand, it has proven to be very challenging to fabricate bulk-heterojunction inorganic systems by conventional vacuum-based processes. This is because the deposition proceeds in a two-dimensional manner, so it is easy to control the composition in a vertical direction, but difficult to control it in the lateral direction. It was not until recently that a solution-based processing of inorganic materials using hydrazine-precursors was demonstrated in $CuInSe_2$ (W. Hou, S. H. Li, C. C. Tung, R. B. Kaner, Y. Yang, in: OSA Solar Energy: New Materials and Nano-structured Devices for High Efficiency, Stanford, Calif., USA, SWC1 2008; D. B. Mitzi, M. Copel, S. J. Chey, Adv. Mater. 17 (2005) 1285). When fabricated from a solution, the material composition can be controlled in both vertical and lateral directions; therefore, a semiconductor junction can be fabricated in a network geometry.

The ability to fabricate bulk-homojunctions relies on the inherent property of materials to exhibit both types of semi-conducting polarity. For instance, the $CuInSe_2$ is known to exhibit both p- and n-type behavior depending on the stoichiometry. $CuInSe_2$ is found to be p-type and $CuIn_3Se_5$ is an n-type material (D. Schmid, M. Ruckh, F. Grunwald, H. W. Schock, J. Appl. Phys. 73 (1993) 2902). The $CuInSe_2$ solution-deposited from a hydrazine-precursor has been demonstrated thus far to have p-type behavior with the $CuInSe_2$ structure. In the following example according to an embodiment of the current invention, solution-deposited $CuIn_3Se_5$ is examined using transmission electron microscopy (TEM) and the photovoltaic performance of the bulk-junction is characterized by examining a solar cell using the material.

Example

Bulk-Junction Photovoltaic Device

Experimental Details

To demonstrate the photovoltaic properties of the bulk-junction, a solar cell was fabricated. In this example, the fabrication process began with the deposition of molybdenum (Mo, 1000 nm) onto a Corning 2947 glass slide by argon dc sputtering. Different substrates such as metal foils and/or plastic films can also be employed. The $CuInSe_2$ layer was deposited by spin-coating the precursor solution onto the Mo layer, followed by thermal annealing at 350° C. for 60 min. The deposition of the $CuInS_xSe_{2-x}$ layer was repeated several times, one layer on top of another, in order to achieve a film thickness of approximately 600 nm. The Cu:In concentrations were kept constant for all three depositions. Both deposition and annealing were carried out in a nitrogen-filled glove box. Next, a cadmium sulfide (CdS) layer was deposited by chemical bath deposition. Finally, 30 nm of intrinsic zinc oxide (ZnO) and 120 nm of indium-tin-oxide (ITO) were deposited by argon rf sputtering to provide the top transparent electrode. The total area of the cell was 0.18 cm², as defined by the shadow mask used during sputtering.

In order to make the precursor solution, 1 mmol of copper sulfide (Cu₂S) and 2 mmol of sulfur (S) were combined with 4 mL of hydrazine. In a separate vessel, 1 mmol of indium selenide (In₂Se₃) and excess S or selenium (Se) were combined with 4 mL of hydrazine. A more detailed description of the precursor synthesis has been reported previously (W. Hou, S. H. Li, C. C. Tung, R. B. Kaner, Y. Yang, in: OSA Solar Energy: New Materials and Nanostructured Devices for High Efficiency, Stanford, Calif., USA, SWC1 2008). Solvents other than hydrazine can also be used to synthesize the precursor solution. After several days of continuous stirring at room temperature, the suspensions of Cu₂S and In₂Se₃ formed clear yellow and colorless solutions, respectively. It was noted that the dissolution of In₂Se₃ in the presence of excess chalcogen is accompanied by a noticeable increase in viscosity. Both solutions were filtered to remove any insoluble species, and were subsequently mixed to form the precursor solution. The amount excess chalcogen (S or Se) in the In₂Se₃ solution is varied depending on the desired chalcogen content in the resulting material.

A bromine solution was prepared by mixing 5 wt-% Br in ethanol. The etching process was performed by immersing the deposited CuInSSe film into Br solution for a certain time. Afterwards, the samples were removed and rinsed with deionized water, and were then fabricated as described above. The TEM samples were prepared by spin casting the precursor solution onto a silicon nitride grid followed by 350° C. annealing for 60 min in a nitrogen environment. The TEM images were taken on the FEI Titan at 200 kV. The scanning electron microscope (SEM) images were taken on a Joel JSM-6700F.

Results and Discussion

Figure 8:
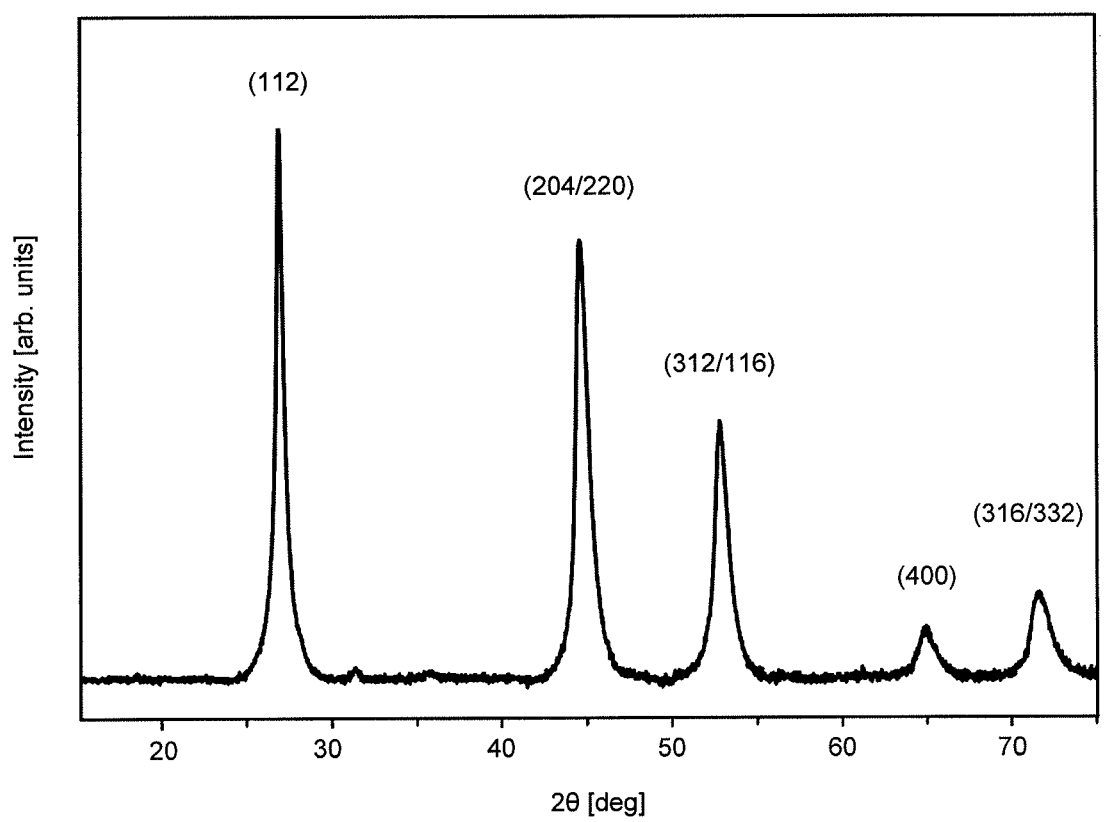
FIG. 8 shows an x-ray powder diffraction pattern taken after heating the precursor solution at 350° C. according to an embodiment of the current invention. The main peaks at 27.2°, 44.62°, 53.66°, 66.04°, and 72.73° 2θ indicate that CuInSSe (JCPDS 036-1311) has been synthesized.
Figures 9, 10:
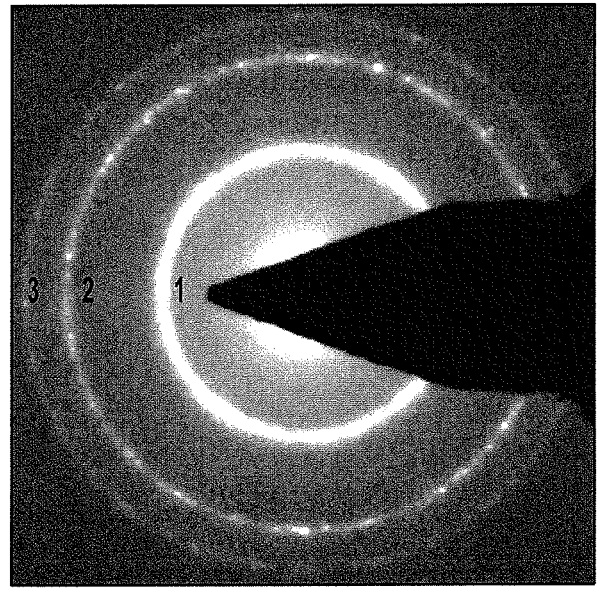
FIG. 9 shows an x-ray diffraction pattern of $CuInS_xSe_{2-x}$ deposited on a SiN grid according to an embodiment of the current invention.
FIG. 10 shows data based on an analysis corresponding to the results shown in FIG. 9.

The X-ray diffraction (XRD) pattern of the powder derived from the hydrazine-precursor, shown in FIG. 8, verifies that the material is of $CuInS_xSe_{2-x}$ structure with minimum sulfur concentration. The absence of $CuIn_3Se_5$ in the XRD pattern is likely due to a combination of the detection limit of XRD and the similarity in the patterns between $CuInSe_2$ and $CuIn_3Se_5$, making it difficult to resolve. For this reason, electron diffraction (ED) is employed and the diffraction pattern is shown in FIG. 9. Based on the analysis from ED (see table in FIG. 10), the material is verified to be $CuIn_3Se_5$ phase. This evidence suggests that in addition to $CuInSe_2$, the material also contains $CuIn_3Se_5$.

Figure 11:
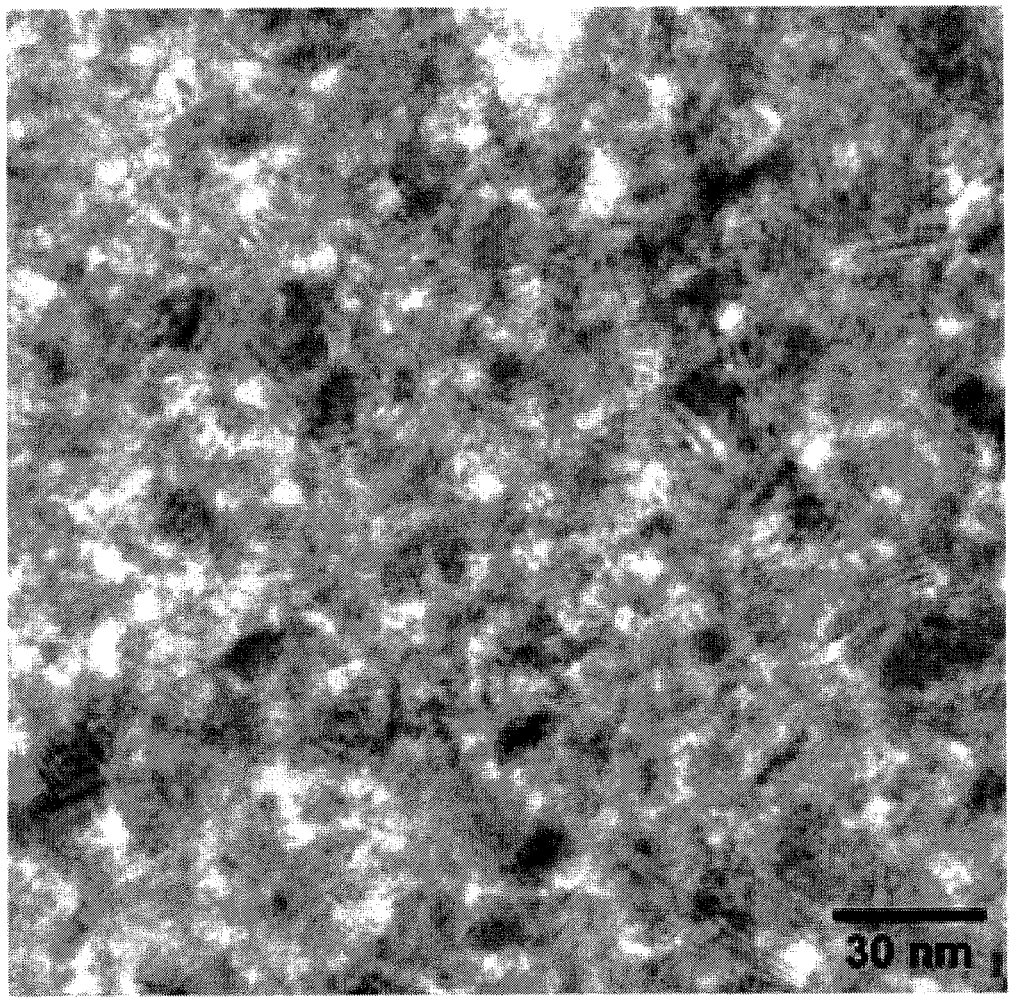
FIG. 11 shows a TEM image of a hydrazine-precursor film after annealing at 350° C. for 60 min according to an embodiment of the current invention.

The morphology of the $CuInSe_2$ film is examined by the TEM image shown in FIG. 11. Unlike the micrometer-size grains that are generally reported in $CuInSe_2$ for photovoltaic applications, the precursor-derived film (annealed at 350° C.) appears to be nano-crystalline. The average grain size is estimated to be 30 nm, which agrees with that calculated from the full width half maximum of the 112 reflection in the XRD pattern.

Figure 12:
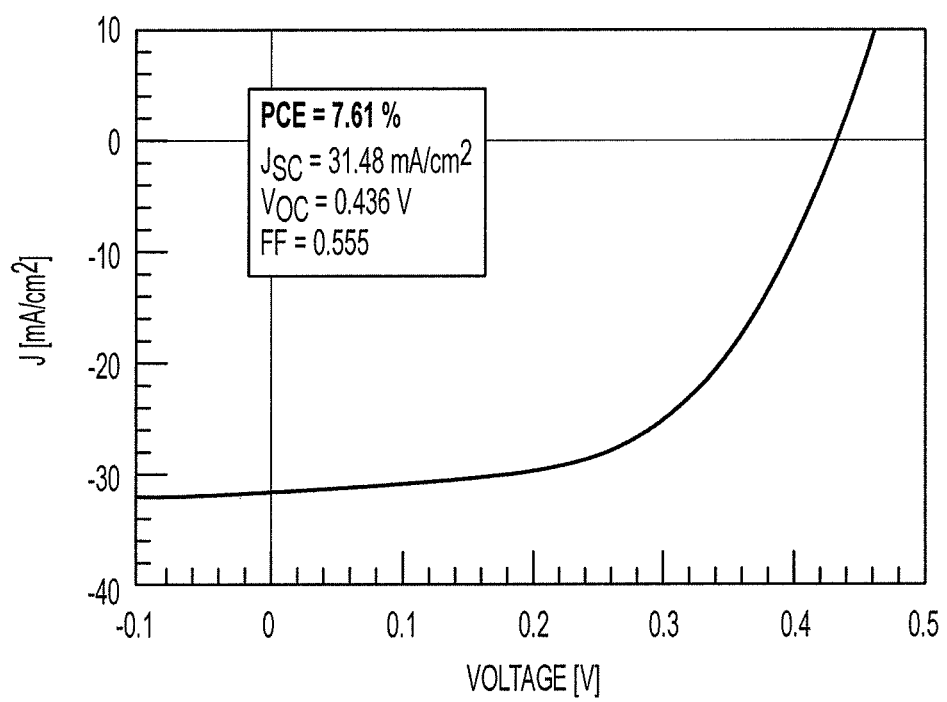
FIG. 12 shows J-V characteristics of a bulk-junction solar cell under AM 1.5 G spectrum at 100 mW/cm² according to an embodiment of the current invention. The absorber layer of the solar cell is solution-deposited from the hydrazine-precursors and annealed at 350° C. for 60 min. The cross-section SEM image

To examine the photovoltaic performance of the bulk-junction, a solar cell is fabricated by adopting the bulk-junction in a device structure of a conventional $CuInSe_2$ solar cell. The J-V characteristics under illuminating conditions and the photovoltaic parameters are shown in FIG. 12. Under 1-sun condition, the solar cell has demonstrated 7.61% power conversion efficiency.

1. Bulk Junction Configuration

Figure 13:
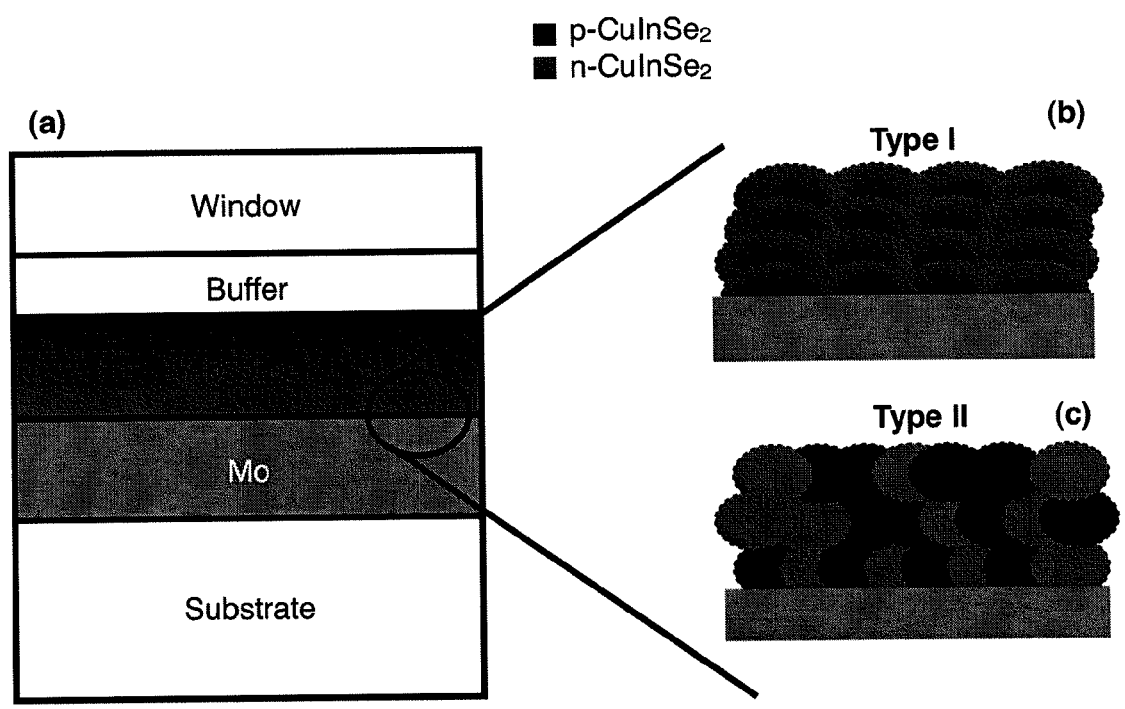
FIG. 13 is a schematic illustration of a solar cell structure in which the absorber layer (active layer) is a bulk-junction having two types of configurations according to an embodiment of the current invention. Type I is based on both p- and n-type semiconductors present in each grain and Type II is has a single type of semiconductor in each grain.

The composition within each grain can be controlled to fabricate Type I configuration (FIG. 13). During the conversion from precursor to chalcopyrite, a certain phase can be favored by manipulating parameters such as heating rate, substrate orientation, precursor composition, and etc. Therefore, the composition within each grain can be tailored to exhibit both p- and n-type semiconductor.

Based on the presence of both $CuInSe_2$ and $CuIn_3Se_5$ that was supported by XRD and ED patterns, respectively, and the nanometer grain size as shown in TEM image, the bulk-junction can be fabricated in the Type II configuration as shown in FIG. 13, where each grain is composed of a single phase, such as $CuInSe_2$ or $CuIn_3Se_5$.

2. Passivation of Defects

Figure 14:
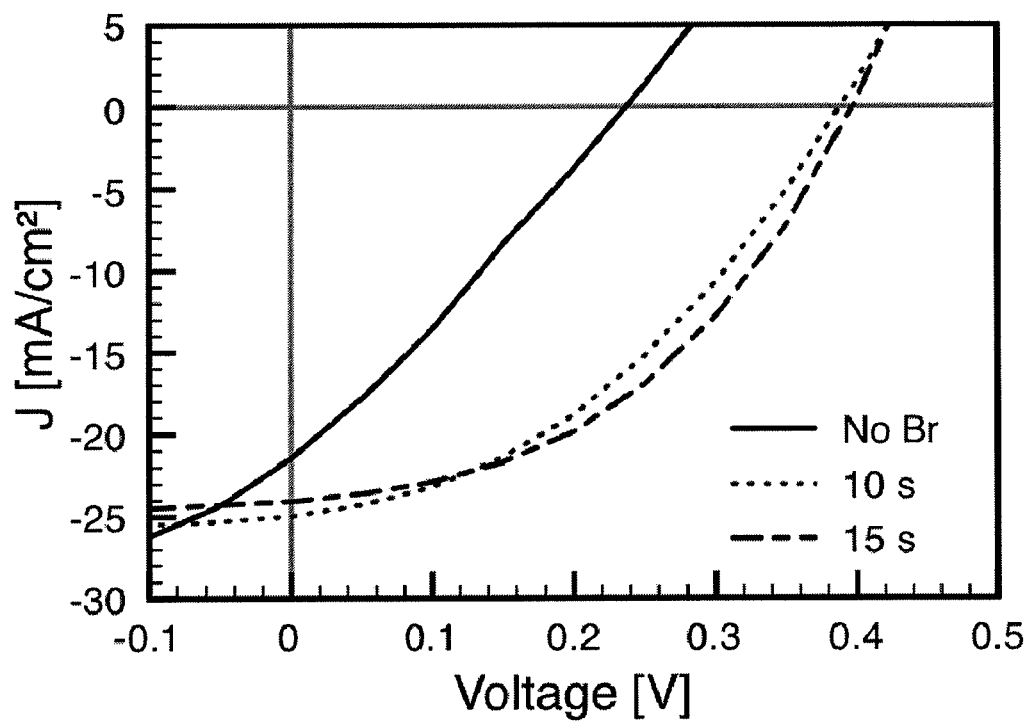
FIG. 14 shows J-V characteristics of $CuInSe_2$-based solar cells under AM 1.5 G spectrum at 100 mW/cm² showing the effect before and after of bromine (Br) etching for 10 s and 15 s according to an embodiment of the current invention.

Due to the polycrystalline morphology in chalcopyrite films, there are grain boundaries that can pose as a recombination center and ultimately lowers the efficiency of the solar cell. This is especially true with the nanocrystalline morphology in bulk-junctions. To overcome this challenge, bromine (Br) can be introduced to passivate the grain boundaries (R. W. Birkmire and B. E. McCandless. Appl. Phys. Lett. 53 (1988) 2). The effect of Br treatment on the bulk-junction layer is reflected in the J-V characteristics shown in FIG. 14.

There is a significant improvement on the photovoltaic performance of the bulk-junction solar cell before and after Br treatment. The power conversation efficiency increases from 1.36 to 4.24% after Br-etching for 15 s. Improvement arises from the increases in open-circuit voltage ($V_{OC}$) from 0.237 to 0.397 V and fill-factor from 26.7 to 44.4, which are good indications on the effect of reduced recombination in the junction.

3. Formation of the Gradient Junction by Layer-by-Layer Coating

We are able to adjust the junction composition by varying the concentration profile through layer-by-layer coating methods, such as spray coating, inkjet printing, and dip coating.

4. The Formation of BJ

In addition to the bulk junction configuration in item 1, we are able to form bulk junctions by purposely introducing n-type materials, including but not limited to CdS and ZnS through diffusion methods.

5. The Formation BJ with Materials Other than CISS and CIGS

In addition to CISS and CIGS, other materials such as Si nano-particles, GaAs nano-particles also can be used to form the junction. The material can be chosen to absorb incident light at different wavelengths.

Transition Metal Doping

Another embodiment of the current invention is directed to improved efficiency solar cells by doping metal chalcogenides with transition metals. We have recently demonstrated solar cells based on hydrazine solution deposited copper indium diselenide (CuInSe2) absorber according to an embodiment of the current invention that have a power conversion efficiency of 7% (William W. Hou, Brion Bob, Shenghan Li and Yang Yang. Thin Solid Films, 517(24), 6853-6856 (2009)). Some promising features of this technology include low cost and low processing temperature (370° C.). The small grain size as a result of the low annealing temperature can introduce limitations for further improvements of the performance. In this embodiment of the current invention, we refined the small grain film by doping extra Cd ions before the CdS deposition. As a result, both the open circuit voltage and power conversion efficiency were noticeably increased. We believe that this enhancement could be due to the passivation of Cu vacancies by Cd.

Example

Cd Doping

Experimental Procedures:

The device investigated in this example consisted of five layers: molybdenum, CuInSe2(CIS), CdS, ZnO and ITO, from the bottom to the top.

The Mo, which serves as the anode, was 1 μm thick and was sputtered onto a pre-cleaned 1 mm thick soda lime glass substrate.

CIS was formed through a solution deposition route (David B. Mitzi, Min Yuan, Wei Liu, Andrew J. Kellock, S. Jay Chey, Vaughn Deline, and Alex G. Schrott, Adv. Mater., 20, 3657-3662 (2008); William W. Hou, Brion Bob, Sheng-han Li and Yang Yang. Thin Solid Films, 517(24), 6853-6856 (2009)). Two precursors, Cu2S and In2Se3 were dissolved in hydrazine and then mixed with a 1:1.4 ratio. A film was deposited by spin coating the precursor solution mixture several times. Between two spin coatings the film was heated at 220° C. for 2 minutes, and after the whole CuInSe2 was deposited, the sample was annealed at 370° C. for 1 hour.

For the baseline process, the CIS film deposition was followed by chemical bath deposition of CdS, using CdAc, NH2Ac, NH3.H2O and thiourea, for 18 minutes at 65° C. A 50 nm CdS layer was then formed on the $CuInSe_2$ layer.

In this embodiment of the current invention, we introduced an additional Cd injection process. Rather than just relying on the natural Cd doping during the chemical bath deposition of CdS (Lars Stolt and Jonas Hedstrom, John Kessler, Martin Ruckh, Karl-Otto Velthaus, and Hans-Werner Schock, Appl. Phys. Lett. 62 (6) 597 (1993); T. Nakada and A. Kunioka, APPLIED PHYSICS LETTERS, 74, 2444 (1999)), we soaked the samples in the CdAc aqueous solution (the precursor for CdS deposition) at 65° C. for 1 hour after $CuInSe_2$ film formation and before CdS deposition. For comparisons, baseline samples which were not treated by this step, and sample which were soaked for a shorter time (10 min or 30 min) were also prepared.

After CdS deposition, ZnO (50 nm) and ITO (100 nm) layers were sputtered onto the sample.

Device characterization methods included current-voltage (IV) measurement under dark and 1-sun illumination (the sunlight is simulated using Newport 91191 1000 W lamp and Newport 69920 power supply), impedance measurement using HP 4284A LCR meter. Transmission electron microscopy (TEM) images were also investigated for baseline samples.

Results and Discussions

Figure 15:
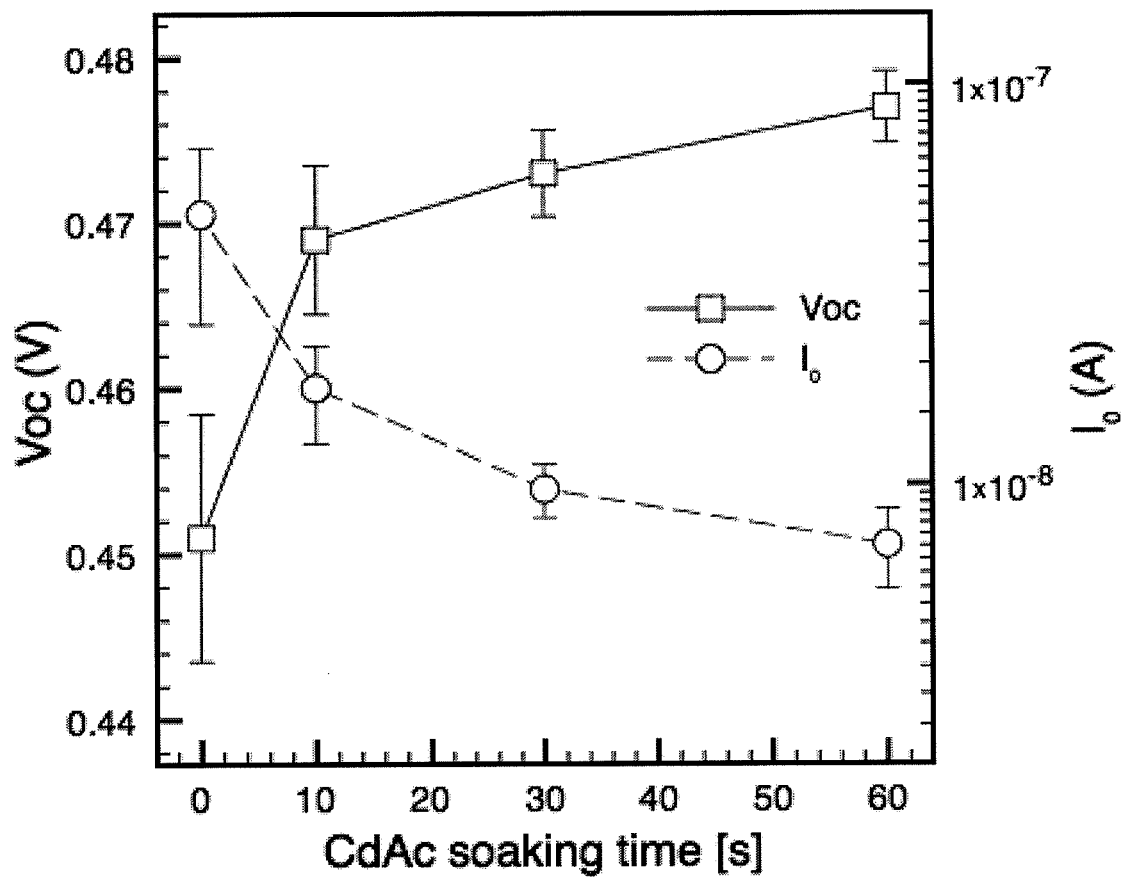
FIG. 15 shows open circuit voltages (Voc) and the reverse saturation current ($I_0$), based on fitting the dark IV curve using the 1-diode model for baseline devices and devices with CdAc soaking according to an embodiment of the current invention.

The open circuit voltages (Voc) and the reverse saturation current ($I_0$), based on fitting the dark IV curve using the 1-diode model, are shown in FIG. 15 for baseline devices and devices with CdAc soaking. A trend shows that by increasing the CdAc soaking time the open circuit voltage increases. Also the reverse saturation current decreases with the soaking time. Both of the two results together suggest a reduction of recombination rate by applying this process.

This enhancement could be the most beneficial with the low temperature processed small grain based system. The large amount of the grain boundary areas in such a CIS film can possibly introduce a significant existence of Cu-poor ordered vacancy compound (OVC) (Su-Huai Wei, S. B. Zhang, Journal of Physics and Chemistry of Solids 66, 1994-1999 (2005)). Cu vacancies near the surface region could assist the diffusion of Cd during CdS deposition (K. Ramanathan, R. N. Bhattacharya, Granata, J. Webb, D. Niles, M. A. Contreras, H. Wiesner, F. S. Hasoon, and R. Noufi, IEEE Photovoltaic Specialist Conference, 319 (1997)). In a typical evaporated CIS device, the Cd ions can diffuse into the CIS film for 10 nm during the chemical bath deposition of CdS. However, in such a small grain system, as a result of the possibly larger Cu concentration fluctuation, Cd diffusion into the CIS film could be more likely to happen, and also more necessary, since the Cu vacancy related defects could act as recombination centers which limits the Voc (Stephan Lany and Alex Zunger, JOURNAL OF APPLIED PHYSICS 100, 113725 (2006)).

The existence of OVC near the CIS film surface is demonstrated by the TEM images.

Figure 16A:
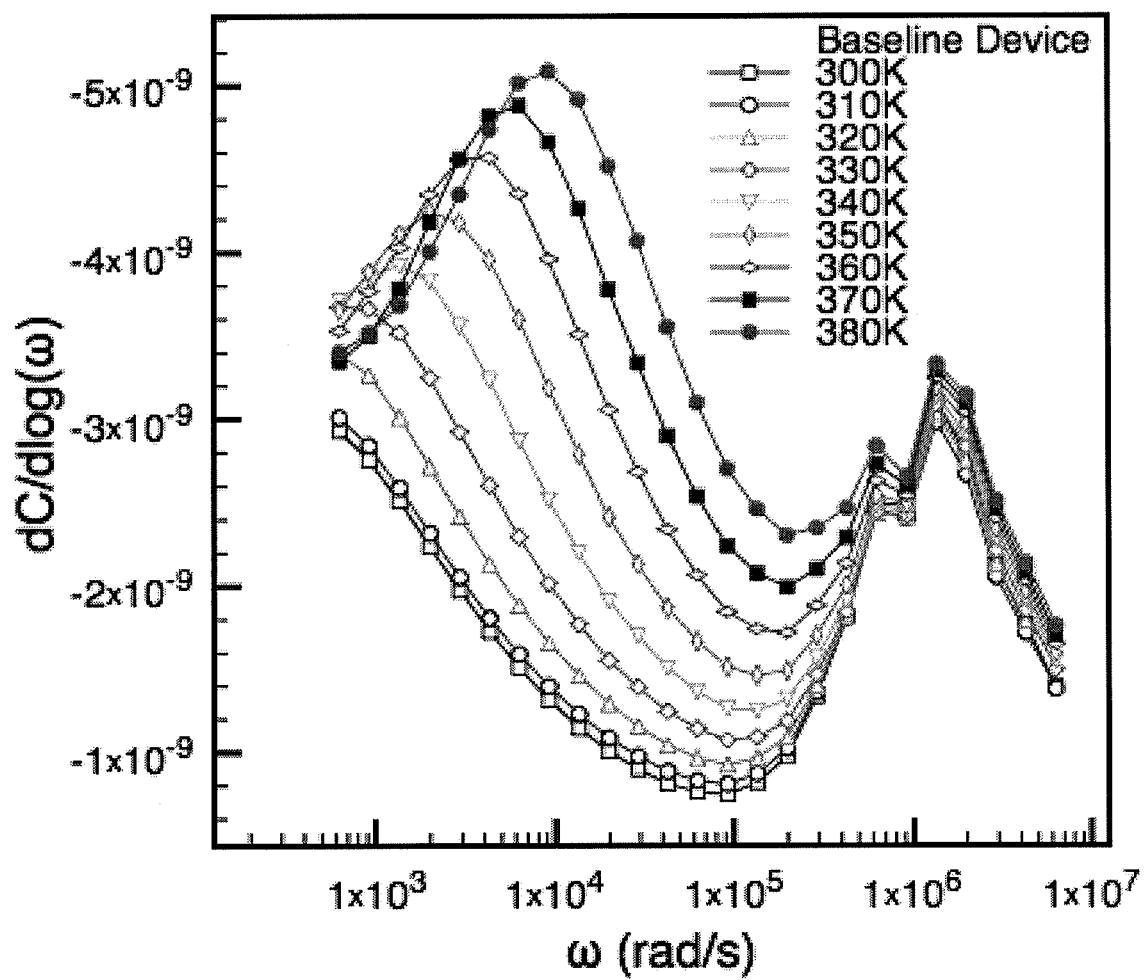
FIGS. 16A and 16B show the derivative of capacitance as a function of angular frequency for a baseline device and a device according to an embodiment of the current invention.
Figure 16B:
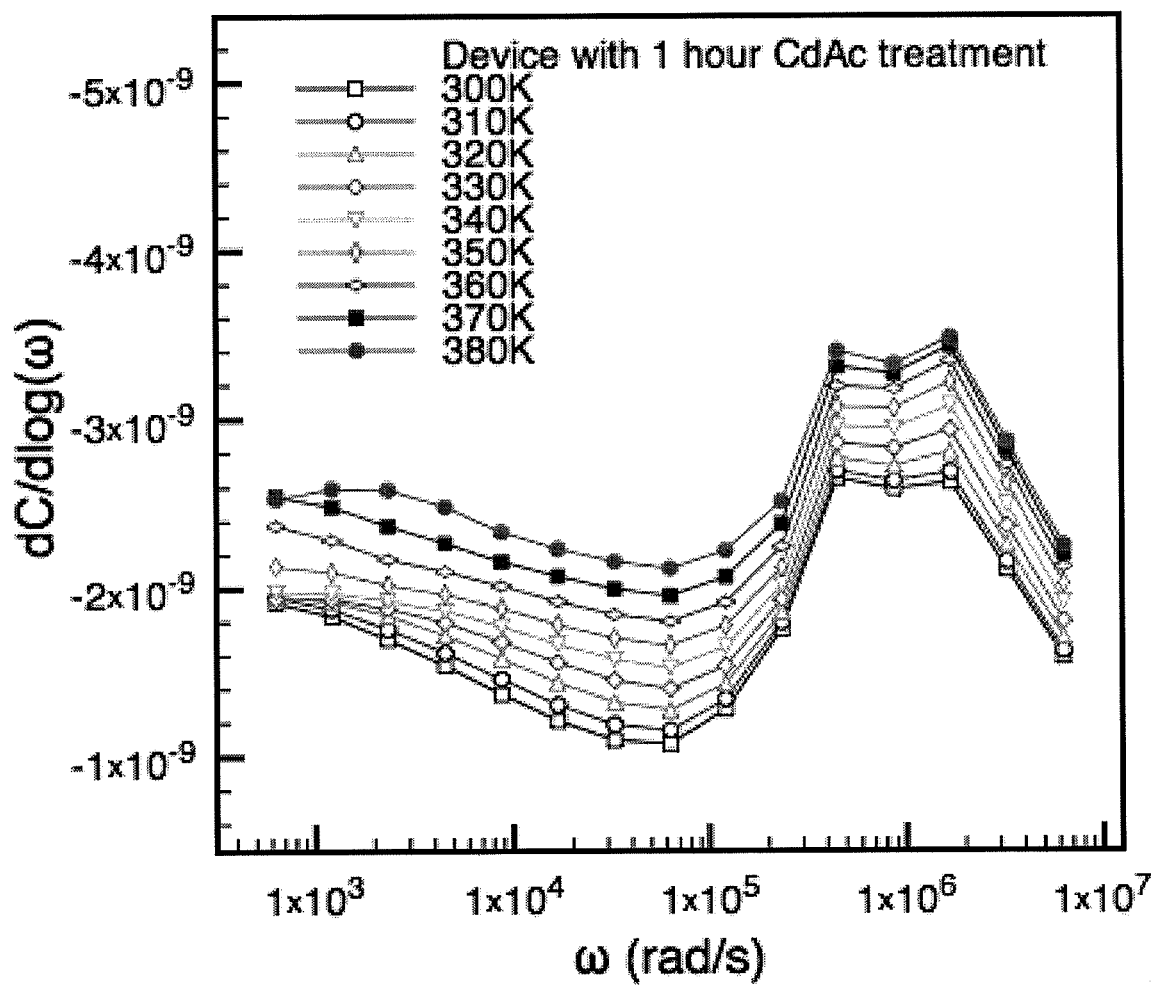

To understand the energy distribution of the defects, admittance spectroscopy (T. Walter, R. Herberholz, C. Müller, and H. W. Schock, J. Appl. Phys. 80 (8), 4411 (1996)) was applied on the baseline device and the device with 1 hour CdAc soaking before CdS deposition. In the temperatures ranging from 300K to 380K, the baseline device showed a step in the capacitance at frequencies from 1 KHz to 10 kHz. The derivative of capacitance as a function of angular frequency is shown in FIGS. 16A and 16B. By fitting the Arrhenius equation it shows that the energy level of this trap is at 0.55 eV from the valence band, which is about the center of the band gap. However, in the device which the CIS film was CdAc treated, the trap at this level is not shown from the admittance spectroscopy experiment. This change could support our proposed mechanism that the trap due to the Cu related defects were electrically passivated during the Cd occupation.

Figure 17:
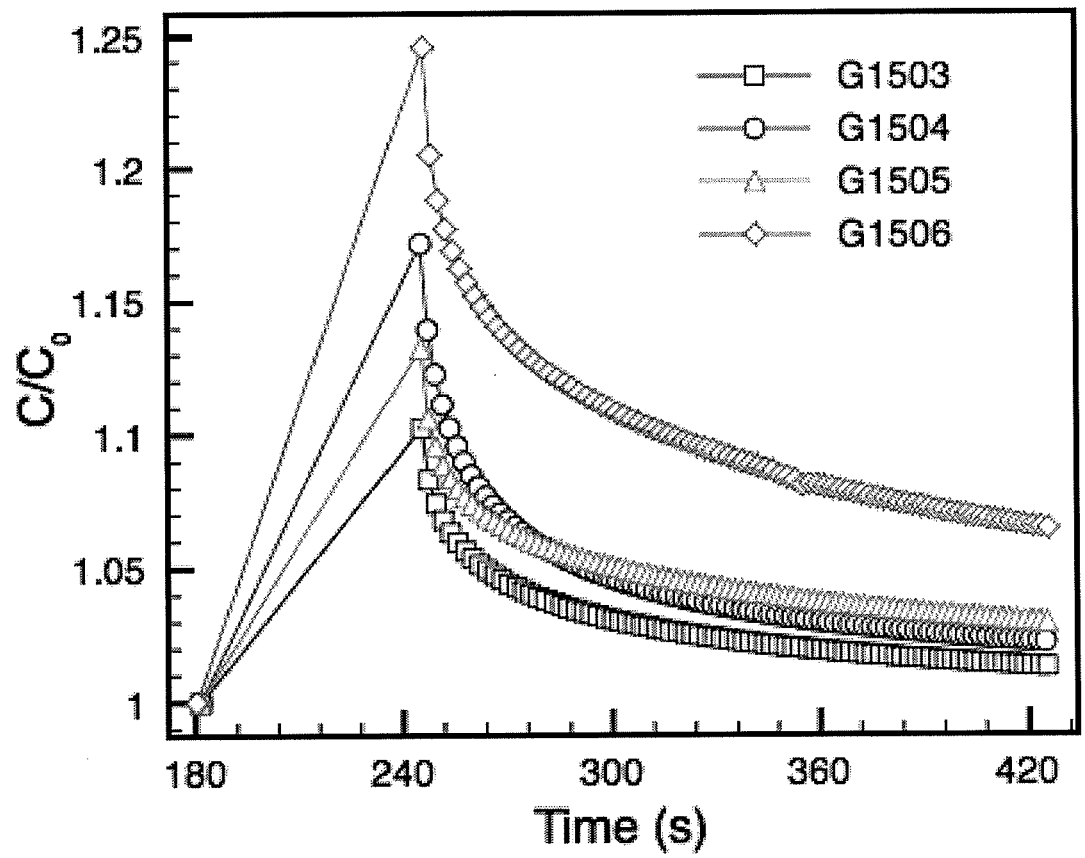
FIG. 17 shows the capacitance change after applying 1V positive bias to the device for 1 minute for a device according to an embodiment of the current invention.

The capacitance transient (Aleksander Urbaniak, Malgorzata Igalson, and Susanne Siebentritt, Mater. Res. Soc. Symp. Proc. Vol. 1012, 1012-Y12-16 (2007)) experiment provided evidence for the same conclusion. FIG. 17 presented the capacitance change after applying 1V positive bias to the device for 1 minute. The baseline device had the most significant rise in the capacitance, while the 1 hour CdAc soaked device was the least affected, suggesting that less electron trapping, or hole emission, occurred as a result of introducing Cd.

The effect on the overall performance, i.e. the power conversion efficiency has been characterized for completed devices, for which the post annealing at 100° C. for at least 30 minutes were performed and a 100 nm $MgF_2$ anti-reflection layer has been deposited on top the ITO. The comparison between the baseline device and the 1 hour soaked device is tabulated in Table I. The average efficiency increased from 7.1% to 8.2% as a result of the CdAc solution treatment, and the improvement is mainly from Voc.

TABLE I

Device Performance

|  | Baseline device | CdAc treated device (1 hour) |
|---|---|---|
| Voc (V) | 0.449 ± 4.714e-03 | 0.471 ± 2.494e-03 |
| Jsc (mA/cm²) | 33.660 ± 0.652 | 33.887 ± 0.135 |
| FF (%) | 50.813 ± 0.651 | 51.387 ± 0.587 |
| PCE (%) | 7.670 ± 0.276 | 8.193 ± 0.160 |

In this example, we have demonstrated an easy process to enhance the open circuit voltage and power conversion efficiency of small grain base CIS solar cell device. By soaking the CIS film in the CdAc aqueous solution at elevated temperature for a long time, the recombination centers and charge traps due to the copper related defects are passivated by a noticeable amount.

The embodiments illustrated and discussed in this specification are intended only to teach those skilled in the art the best way known to the inventors to make and use the invention. Figures are not drawn to scale. In describing embodiments of the invention, specific terminology is employed for the sake of clarity. However, the invention is not intended to be limited to the specific terminology so selected. The above-described embodiments of the invention may be modified or varied, without departing from the invention, as appreciated by those skilled in the art in light of the above teachings. It is therefore to be understood that, within the scope of the claims and their equivalents, the invention may be practiced otherwise than as specifically described.

We claim:

1. A method of producing a photo-voltaic device, comprising:
    dissolving metal chalcogenides in a solvent to provide a precursor solution having a concentration of chalcogenides in solution of less than about 1 mmole/ml;
    heating a substrate to a temperature between 300° C. and 600° C.;
    spraying at least a portion of said precursor solution onto a structure comprising said substrate to be annealed to form at least part of an active layer of said photo-voltaic device; and
    varying a concentration of copper in said precursor solution to provide a concentration gradient of copper in a vertical direction as said spraying builds up said active layer in said vertical direction so as to provide an average grain size of at least 20 nm,
    wherein said concentration of copper in said precursor solution is varied by varying an amount of solvent in said precursor solution.

2. A method of producing a photo-voltaic device according to claim 1, wherein said concentration of chalcogenides in solution of less than 0.5 mmole/ml and greater than 0.05 mmole/ml.

3. A method of producing a photo-voltaic device according to claim 1, wherein said solvent comprises hydrazine.

4. A method of producing a photo-voltaic device according to claim 1, wherein said metal chalcogenides comprise at least one of Cu, In, Ga, Zn, Sn, Na, K, Al and P.

5. A method of producing a photo-voltaic device according to claim 1, wherein said metal chalcogenides comprise $In_2Se_3$ and $Cu_2S$.

6. A method of producing a photo-voltaic device according to claim 1, further comprising:
    spraying at least a second portion of said precursor solution onto a composite structure comprising said substrate and said active layer to be annealed to form at least part of a second active layer of said photo-voltaic device to provide a tandem photo-voltaic device comprising at least two electrically connected active layers.

7. A photo-voltaic device produced according to the method of claim 1.

8. A method of producing a photo-voltaic device according to claim 1, wherein said heating said substrate is performed simultaneously with said spraying said at least said portion of said precursor solution.

* * * * *